(12) United States Patent
Jackson et al.

(10) Patent No.: US 6,536,106 B1
(45) Date of Patent: Mar. 25, 2003

(54) ELECTRIC FIELD ASSISTED ASSEMBLY PROCESS

(75) Inventors: Thomas N. Jackson, State College, PA (US); Theresa Mayer, Port Matilda, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/608,796

(22) Filed: Jun. 30, 2000

(65) Prior Publication Data (65)

Related U.S. Application Data
(60) Provisional application No. 60/141,723, filed on Jun. 30, 1999.

(51) Int. Cl.[7] .............................................. H01R 43/00
(52) U.S. Cl. ............................. 29/872; 29/832; 29/834; 29/868; 29/873; 204/155; 204/164; 204/108; 204/232; 204/437; 204/438; 438/14; 438/400; 438/401; 427/462; 427/466; 427/467; 427/469
(58) Field of Search .......................... 29/832, 834, 868, 29/872, 873; 204/155, 164, 232, 108, 437, 438; 438/14, 400, 401; 427/462, 466, 467, 469

(56) References Cited

U.S. PATENT DOCUMENTS

| | | | | | |
|---|---|---|---|---|---|
| 4,016,456 A | * | 4/1977 | Birks et al. | ................. | 361/288 |
| 4,956,065 A | * | 9/1990 | Kaler | ...................... | 204/183.1 |
| 5,008,043 A | * | 4/1991 | Robello | ...................... | 252/582 |
| 5,196,212 A | * | 3/1993 | Knoblach | ................. | 425/174.8 |
| 5,755,944 A | | 5/1998 | Haven et al. | ............... | 204/486 |
| 5,894,367 A | * | 4/1999 | Sheridon | .................... | 359/623 |
| 5,975,680 A | | 11/1999 | Wen et al. | .................... | 347/43 |
| 6,074,442 A | * | 6/2000 | Kobayashi | ................. | 29/25.01 |
| 6,107,038 A | | 8/2000 | Choudhary et al. | ............ | 435/6 |
| 6,190,509 B1 | * | 2/2001 | Haba | .......................... | 204/164 |
| 6,197,176 B1 | * | 3/2001 | Pethig | ........................ | 204/643 |

OTHER PUBLICATIONS

Aviram et al. "Molecular Rectifiers." Chem. Phys.Lett. 29, pp. 277–283, 1974.

Chen et al. "Large on–Off Ratios and Negative Differential Resistance in a Molecular Electronic Device." Science 286, pp. 1550–1552, 1999.

Collier et al. "Electronically Configurable Molecular–Based Logic Gates." Science 285, pp. 391–394, 1999.

Green et al. "Dielectrophoretic Separation of Nano–Particles." J. Phys. D.: Appl. Phys. 30, L41, 1997.

Hertel et al. "Manipulation of Individual Carbon Nanotubes and Their Interaction with Surfaces." J. Phys. Chem. B 102, pp. 910–915, 1998.

Jackson et al. "Fabrication of Three–Dimensional Microstructures by Electrochemical Welding Structures Formed by Microcontact Printing on Planar and Curved Substrates." J. Microelectromechanical Systems. vol. 7, No. 2, Jun. 1998, pp. 261–265.

(List continued on next page.)

Primary Examiner—Peter Vo
Assistant Examiner—Paul D Kim
(74) Attorney, Agent, or Firm—Ohlandt, Greeley, Ruggiero & Perle, L.L.P.

(57) ABSTRACT

This invention is directed toward a process of manufacturing, including a technique of assembling parts of an apparatus. The technique includes forming electrode structures on a substrate, suspending the apparatus part or parts in a dielectric medium between electrodes of the electrode structure, and using near-field (that is, short range) electric field forces to align the part or parts in predetermined positions in accordance with the desired apparatus topography. The part or parts may include semiconductor die, nanometer wires for making connections to devices, or other components requiring precision alignment.

38 Claims, 6 Drawing Sheets

OTHER PUBLICATIONS

Libioulle et al. "Contact–Inking Stamps for Microcontact Printing of Alkanethiols on Gold." Langmuir. 15, pp. 300–304, 1999.

Martin et al. "Orthogonal Self–Assembly on Colloidal Gold– Platinum Nanorods." Adv. Mater. 11, No. 12, pp. 1021–1025, 1999.

Metzger et al. "Languir–Blodgett Films of Potential Donor–Sigma–Acceptor Organic Rectifiers." J. Mol. Elec. 5, 1, pp. 1–17, 1999.

Miles et al. "The Dielectric Behavior of Colloidal Particles with an Electric Double–Layer." Phys. Rev. 40, pp. 583–591, 1932.

Pohl, H.A. "The Motion and Precipitation of Suspensoids in Divergent Electric Fields." J. Appl. Phys. 22, pp. 869–871, 1951.

Roychowdhury et al. "Nanoelectronic Architecture for Boolean Logic." Proceedings of the IEEE. vol. 85, No. 4, pp. 574–588, 1997.

Schwarz, G. "A Theory of the Low–Frequency Dielectric Dispersion of Colloidal Particles in Electrolyte Solution." J. Phys. Chem. vol. 66, pp. 2636–2642, 1962.

Terfort et al. "Three–Dimensional Self–Assembly of Millimetre–Scale Components." Nature. vol. 386, pp. 162–164, 1997.

Van der Zande et al. "Alignment of Rod–Shaped Gold Particles by Electric Fields." J. Phys. Chem B. vol. 103, pp. 5754–5760, 1999.

Wilbur et al. "Microfabrication by Microcontact Printing of Self–Assembled Monolayers." Adv. Mater. vol. 6, No. 7/8, pp. 600–604, 1994.

Yamamoto et al. "Orientation and Purification of Carbon Nanotubes Using AC Electrophoresis." J. Phys. D: Appl. Phys. vol. 31, pp. L34–L36, 1998.

Service, Robert F. "Building the Small World of the Future." Science. vol. 286, pp. 2442–2444, Dec. 24, 1999.

* cited by examiner

ELECTRIC FIELD ASSISTED ASSEMBLY PROCESS

This application claims the benefit of Provisional Application No. 60/141,723, filed Jun. 30, 1999.

This invention was made under a contract with the Office of Naval Research #N00014-98-1-0846.

FIELD OF THE INVENTION

The present invention relates to the assembly of micro- and nano-scale devices and components suspended in a dielectric medium onto a substrate patterned with electrodes that are used to attract and align the devices and components. The substrate on which the devices and components are assembled could contain existing active circuitry to which the components or devices are integrated or the substrate could be used as a template for assembly of more complex standalone two and three-dimensional structures.

BACKGROUND OF THE INVENTION

As the market for low-cost and/or high-performance/density micron- and nano-scale electronic and electromechanical integrated circuits increases, many new assembly and integration techniques must be developed. As an example, at the micron-scale, it has become increasingly important to manufacturers of compound semiconductors to integrate high-performance optoelectronic and/or radio frequency components onto dissimilar substrates. Often these substrates contain active circuitry to which the compound semiconductor devices must be integrated monolithically to improve system performance and reduce assembly costs. While current integration strategies often rely on pick-and-place mechanical assembly, new low-cost parallel assembly techniques are being investigated and commercialized.

In addition to integration of relatively large-scale devices and components, there has also been a continued interest in scaling to nanometer dimensions the size of individual devices. Current semiconductor manufacturing technology typically relies on integration of silicon devices using photolithographic techniques. Recently, there has been increasing interest in novel nano- and molecular electronic circuit topologies. One of the limiting factors is the integration of the devices with nanometer scale interconnects. Alternative approaches based on assembly of metallic nanowires and carbon nanotubes have been proposed, but few assembly strategies exist.

In reference to integration of micron-scale devices and components, heterogeneous integration of high performance electrical, optoelectronic, and micro-electro-mechanical devices together onto the same substrate is critical for the development of high-performance microsystems. Of particular interest is integrating these types of devices with silicon CMOS technology, in order to increase the number of on-wafer functions available, and ultimately reduce the size, weight, and cost of micro-device based systems. As the dimensions of micro-electronic and micro-electromechanical devices and systems decrease, and as their complexity increases, there is a need to use self assembly techniques to simplify the assembly and processing of these devices.

Several promising approaches have been presented for integration of different types of micro-devices on the same substrate, including selective area growth, flip-chip bonding, epitaxial lift-off (ELO), fluidic self-assembly and electrostatic alignment. However, each of these approaches has drawbacks and technological issues that limit their utility in actual applications.

Selective area growth was investigated early as a potential method of heterogeneous integration. After the front-end, high-temperature, portion of the silicon CMOS process is completed, epitaxial material is grown on a buffer island. This procedure results in devices that can be processed in conjunction with the back-end silicon process. However, due to lattice mismatch and thermal property mismatch, the devices grown on silicon are not as good as devices grown on a lattice-matched substrate.

Flip chip bonding is commonly used for aligning individual devices. In this process, individual die are diced from growth wafers and mounted upside-down on a host substrate. The fully processed active devices are individually placed onto bonding sites with a mechanical pick-and-place tool. The devices are held into place by solder bonding, and then the substrate is removed by etching, if desired. Because this process involves serial manipulation and alignment of individual device die, it is time consuming and expensive.

Other procedures for heterogeneous integration include epitaxial transfer procedures such as ELO and applique. For both processes, an epitaxial layer is generally released from its growth substrate, either by etching a sacrificial layer (ELO) or by etching the substrate down to an etch-stop layer (applique). The layer, which is typically supported by a wax or polymer membrane, is then bonded to the host substrate through van der Waals bonding or with a metal bond. Depending upon the process requirements, the devices can be processed either before or after the transfer of the epitaxial layer to the host substrate. ELO and applique techniques, which have been used for the integration of optical devices with silicon CMOS, are disadvantageous for at least two reasons. First, handling extremely thin epitaxial layers is difficult and tedious. Second, any pre-processed devices need to be aligned to existing circuitry on the host substrate, which is difficult and time-consuming when compounded with the thinness of the epitaxial film.

Another procedure that can be used to transfer an entire epitaxial layer is wafer bonding. Typically, an epitaxial structure is grown upside down on a growth wafer. The growth wafer and the host wafer are bonded together, and the growth wafer is removed to expose the epitaxial layers. The epitaxial layers are then processed to create the devices. Unfortunately, bonded wafers suffer from thermal limitations, due to thermal expansion mismatch of the wafers, and due to different thermal budgets for the two different materials.

For successful, efficient heterogeneous integration, a process that will align separate discrete die without individual manipulation of the devices is required. There have been two approaches published that meet these requirements. These approaches are fluidic self-assembly and vector potential parts manipulation.

Fluidic self-assembly, in which carefully etched device die are mated to a substrate with etched holes of matching dimensions, is one process that will align separate devices without individual manipulation. The host substrate is patterned with deep holes that match the shape of the device die. The specially shaped device die are lifted-off of the growth substrate, suspended in a solution, and flowed over the host substrate. The parts align themselves into the holes in the host substrate. However, fluidic self-assembly requires that the device die are trapezoidally shaped, to match the openings in the substrate. This shape requirement is a task that is difficult to achieve and adds several processing steps, such as ion-milling.

Another process that allows for the alignment of separate device die is potential-driven assembly. This process uses a potential, most often electrostatic, to direct and place parts. Parts are placed on a vibrating stage and are attracted to potential wells on the substrate. As the vibration is reduced, the parts "anneal" into place. At this time, this technique has only been used to manipulate relatively large parts using high voltages in a specially prepared alignment fixture.

While the techniques discussed above describe approaches that either are in use or under development for the alignment of micron-scale objects such as semiconductor devices and die, a new area of research is developing in nanometer- and molecular-scale electronics for ultra-high density and performance logic and memory circuits. In these applications present photolithographic techniques grow exponentially more expensive with decreasing feature size, and may never reach the dimensions required for this new technology. Based on these limitations, it has been suggested that future device integration may be based on alternative approaches that rely on assembly of nanometer-scale colloidal particles such as isotropic and anisotropic metallic particles and carbon nanotubes. Therefore, research has focused on developing new chemical and electric field-assisted assembly techniques to control the placement of these particles with the precision required to form well-ordered logic and memory circuits.

Following the pioneering work of Pohl, described in H. A. Pohl, J. Appl. Phys. 22, 869 (1951), and H. A. Pohl, Dielectrophoresis (Cambridge University Press, 1978), non-uniform electric fields have been used to manipulate dielectric particles that are suspended in liquid media.

While considerable effort has been devoted to separating biological particles, dielectrophoresis has also been used recently to (1) orient colloidal dispersions of nanometer-scale rod-shaped gold particles in an electrooptical cell and (2) to align carbon nanotubes between biased electrodes on a glass substrate. In the second application, the nanotubes aligned randomly along the electrode edge with their length oriented in the direction of the electric field.

SUMMARY OF THE INVENTION

Despite the interesting prior art developments in this field of micro-devices, the ultimate in optimization has yet to be realized. Accordingly it is a primary object of this invention to provide a method of combining different devices and materials on a single substrate, with materials and processing optimized for each individual device. It is a further object of this invention to provide an efficient, rapid method of placing, aligning, and interconnecting separate discrete components.

The foregoing and other problems are overcome and the objects of the invention are realized by a process of manufacturing, including a technique of assembling parts of an apparatus. The technique includes forming electrode structures on a substrate, suspending the apparatus parts in a dielectric medium near the electrode structure, and applying a non-uniform electric field to align the parts in pre-determined positions in accordance with the desired apparatus topography. The mechanism of alignment is near-field electric field forces developed between the electrode structures and the parts being aligned, either singly, or in combination with longer range forces such as, for example, dielectrophoretic forces or fludic self-assembly forces. While the parts may include semiconductor die or nanometer wires for making connections to devices, the invention is not limited to those devices but may include any device capable of being assembled in this manner.

DETAILED DESCRIPTION OF THE PREFERRED EMBODIMENTS

Figure 1:
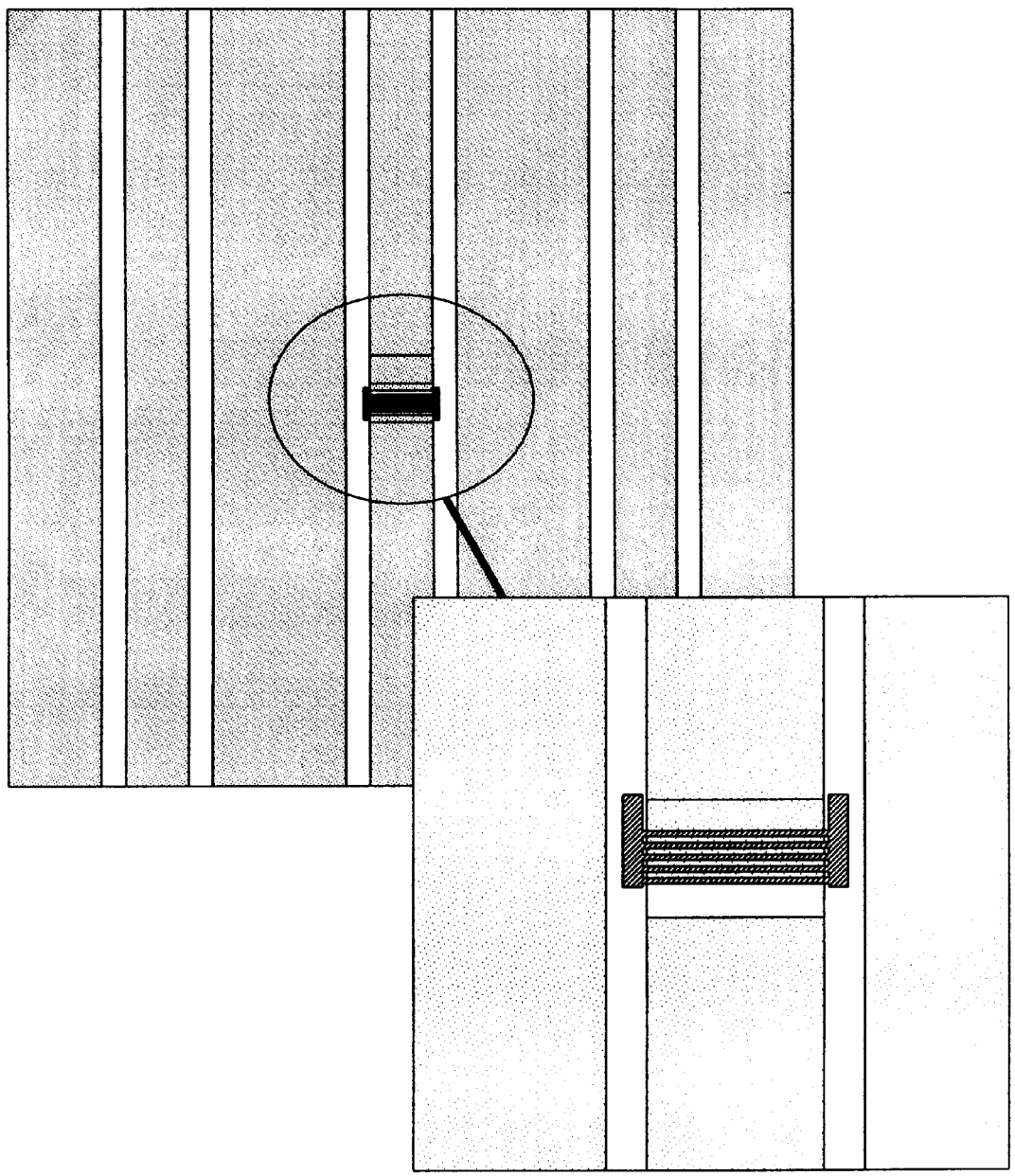
FIG. 1 contains optical microscope images of a glass part with conductive wiring aligned to electrode structures using near field forces. This part was aligned to electrode elements on a silicon substrate. For simplicity, the alignment process used will be illustrated using simple metallic nanowires.

This invention disclosure describes a process that can be used to place and align individual pieces onto predetermined locations on a substrate using electric fields in a fluid. An electric field will produce several effects on a particle within the field. If the particle has a net charge, a force will be generated on the particle according to the charge on the particle and the direction of the field. This force is known as electrophoresis, and applies in both non-uniform and uniform DC fields, but not AC fields. If the particle is neutral, it will experience no net force in a uniform field, however, the field will induce a dipole moment in the particle.

As noted above, application of a non-uniform electric field will cause a net force in the direction of increasing electric field for a conducting device in a polar medium. This force, which exists for both AC and DC non-uniform fields, does not depend on any net charge on the piece, but rather on charge separation and the field non-uniformity. This phenomenon, known as dielectrophoresis, has been noted above as being useful to manipulate colloids and other sub-micron particles. Dielectrophoresis can be considered a long range force since it depends on the presence of a non-uniform electric field and does not require electrode structures having a size similar to that of the parts or particles being aligned. In aligning colloids or biological particles this is an important advantage since the electrodes used to provide particle motion need not be fabricated at the size or precision of the parts being aligned, but can be much larger. The present invention uses more complex electrode structures that provide near-field forces that allow more precise alignment, greater alignment and capture forces, and simplified alignment of multiple parts. The parts and devices to be aligned may include die and other parts to form heterogeneous circuits.

In order to perform the alignment, a substrate, which may or may not have pre-processed circuitry on it, and need not be planar, is prepared to create sites to which the device will be attracted. In order to do this, electrode structures are fabricated on the substrate. The electrode structures create electric fields that will attract the parts from within the solution. While the present invention involves the use of short range or near field electric field force, this technique may be combined with longer range forces such as dielectrophoresus or fluidic forces. The electrodes are preferably designed so that when a particular part has been aligned to a given site, the field will be shielded and no other parts will be attracted to that site. To allow a muliplicity of parts to be simultaneously aligned, an insulating layer may be positioned between the part and an electrode element to prevent the electrode from being short-circuited by the part. After all the parts have been aligned and placed on the substrate, they can be permanently bonded to the host substrate, and any additional cleaning or processing to complete the assembly can be performed.

A variety of choices are possible for the fluid for the electric field alignment. The fluid serves several functions. Buoyancy effects can be used to minimize gravitational effects which may be significant for larger scale devices. Proper choice of fluid can render even large components essentially massless from a non-inertial perspective. Fluid viscosity is also a factor in aligning devices. For example, a high viscosity fluid may minimize brownian motion in small scale devices and may further protect components from inertial damage by limiting alignment speed. In contrast, a low viscosity fluid will allow for faster alignment. The dielectric characteristics of the field are also important. Generally, the dielectric and charge transport properties of the fluid can be chosen to optimize the desired alignment. Relative differences in the permittivity, conductivity, and dielectric loss properties between the fluid and the components to be aligned can all be used as a driving force for alignment. In some cases, electric current transport effects can also be used, for example, ion drag effects can provide a large driving force for aligning components, especially micro and nano scale components. It should also be noted that the fluid used for alignment can be liquid, gas, a combination, or any material, including even vacuum, suitable for alignment of the particular types of devices being used. The fluid need not be homogeneous. For example, two or more immiscible fluids with more than one density can be used to spatially define components in desired regions, and miscible fluids with different characteristics may be used to disperse or move components using dispersive forces.

In order to facilitate the motion of the parts, mechanical agitation can be provided to the entire system of substrate, fluid, and suspended parts. This agitation, which can be provided by stirring, shaking, circulation, vibration, or a combination of these excitations, encourages the parts to move around until they are "trapped" by an alignment site. To aid in the alignment process, the devices and the substrate may be treated to cause hydrophobic/hydrophilic or other surface energy effects. This treatment may include any process capable of causing hydrophobic/hydrophilic or other surface energy effects that would aid in the assembly or alignment processes.

Other problems, more common in small scale assembly applications, are aggregation of devices, that is, adhesion between parts, and adhesion between devices and the substrate. In order to avoid this, the devices and/or and substrate may be selectively treated with a coating that modifies the surface functionality and prevents attachment. Examples of such coatings include self-assembled monolayers and multilayer poly-electrolytes.

Referring to FIG. 1, as an example of this assembly approach, a glass part is aligned to electrode structures using near-field forces. The test part shown in FIG. 1 is a glass part approximately 100 $\mu$m by 150 $\mu$m and about 1 $\mu$m thick. The glass part contains conducting wiring and has been aligned to electrode structures designed to provide near-field or short range alignment forces. The substrate electrode structures are designed in size and pattern so that large alignment forces are generated between the glass part and the substrate electrode structures. For simplicity, only one part is show aligned on a substrate with multiple alignment electrodes. By supplying additional parts electrode structures at other alignment sites would provide alignment. As parts are aligned on to electrode structures at alignment sites, the parts shield the near field forces so that no additional parts are attracted or aligned.

The part aligned in FIG. 1 is brought close to the near field electrode structures by longer range dielectrophoretic forces. However, other approaches could be used, including, for example, fluidic motion, or mechanical placement, and final alignment is then accomplished by near field electric field forces.

While these results are described in the context of a simple glass part, it should be understood that use of other types of die, including semiconductor die, are contemplated by this invention. It should also be understood that this technique is not limited to transporting and placing die, but that this technique may be used to transport and place devices of any type and scale that are capable of being assembled using this technique.

With reference to a further aspect of the invention, a technique utilizing near field electric field forces to precisely align components in a colloidal suspension will now be described. As an example, this alignment technique has permitted rapid electrical alignment of nanowires between lithographically defined metal pads, where the nanowires range in size from 35 to 200 nm in diameter.

Figure 2:
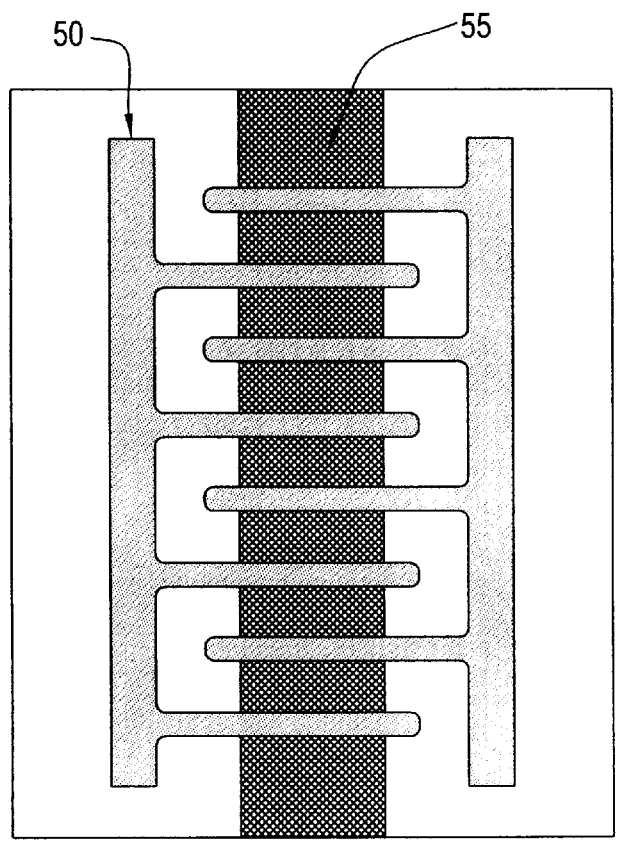
FIG. 2 shows top and cross-sectional views of example electrode structures for use in near-field electric field assisted assembly.
Figure 2:
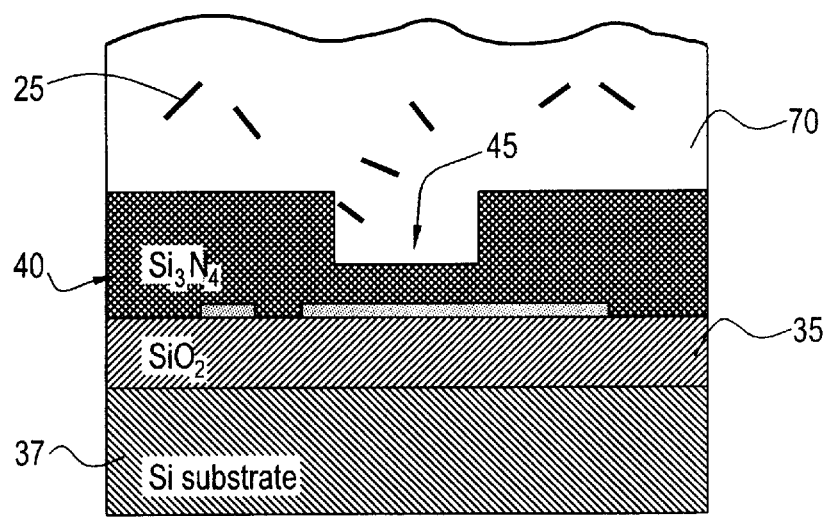

Referring now to FIGS. 2–6, electric field assisted assembly of nanowires 25 (FIG. 4) is carried out using electrically isolated electrode fingers 55 shown as a top view and cross section in FIG. 2. The metal electrode fingers 55 consist of an interdigitated finger pattern obtained, for example, by a metal liftoff process of 50 nm Ti/150 nm Au on a silicon dioxide ($SiO_2$) coating 35 over a substrate 37, where the finger width and separation is 2 and 5 $\mu$m. The electrode fingers 55 may be protected with a 500 nm thick layer 40 of silicon nitride ($Si_3N_4$) deposited by plasma enhanced chemical vapor deposition (PECVD) to prevent shorting of the electrode fingers 55 by the metallic nanowires 25 during the assembly process. As shown in FIG. 2, a 30 $\mu$m wide stripe, or thin layer, 45 of the thick $Si_3N_4$ layer 40 immediately above the interdigitated fingers may be reduced from 500 to 100 nm to increase the field strength in these areas relative to those covered by the thick $Si_3N_4$ layer 40. A fluid dielectric medium 70 is dispensed over the thick layer 40 and thin layer 45 of silicon nitride ($Si_3N_4$).

Figure 4:
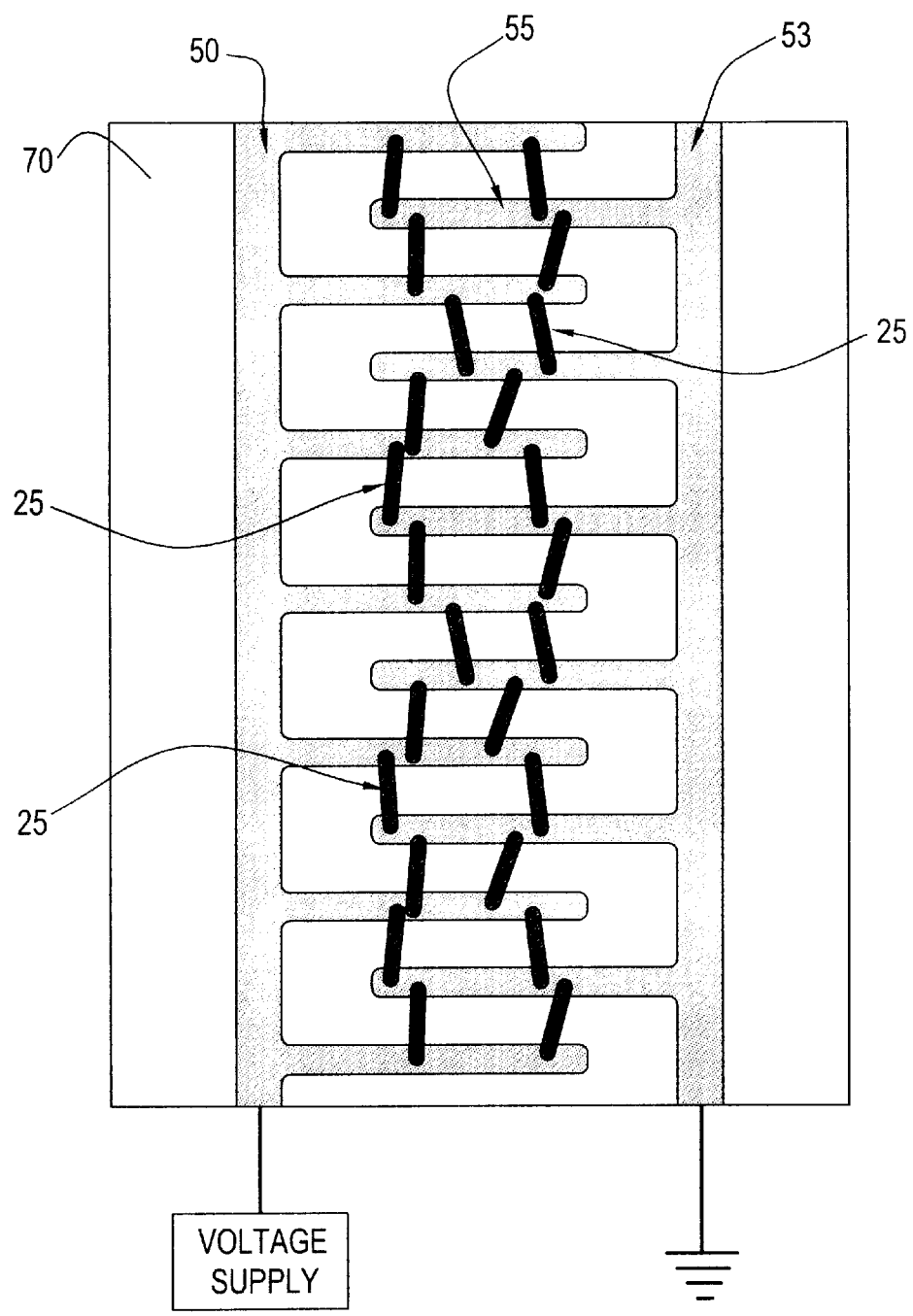
FIG. 4 shows an optical microscope image of nanowires aligned by applying a 30V, 1 kHz voltage to the structure without upper field electrodes.

Assembly is conducted by dispensing a dilute solution of nanowires 25 onto samples biased with ac electrode voltages ranging from 5 to 70 $V_{rms}$, which correspond to electric field strengths of $10^4$ to $1.5 \times 10^5$ V/cm. An optical microscope image of nanowires 25 that are aligned by applying a voltage, for example, of 30 $V_{rms}$ at a frequency of 1 kHz to a left electrode 50 relative to a right grounded electrode 53 is shown in FIG. 4. As shown in FIG. 4, the nanowires 25 align vertically between the interdigitated electrode fingers 55 in the high field regions covered with the thin $Si_3N_4$ layer 45. Although vertical alignment is achieved, the nanowires 25 are distributed randomly along the electrode fingers 55. Vertical alignment is observed for electrode voltages exceeding 25 $V_{rms}$, with the length of time required for the nanowires 25 to align decreasing from 9 to 5 sec. as the bias increases from 25 to 70 $V_{rms}$.

This procedure indicates that vertical alignment of the nanowires 25 between the electrode fingers 55 is due to near field forces that attract the nanowires 25 toward the electrode fingers 55. The metallic nanowires 25 polarize readily in the alternating electric field due to charge separation at the surface of the nanowire 25 and within the double layer that forms in the fluid dielectric medium 70(i.e., IPA). Because the nanowires 25 are more polarizable than the fluid dielectric medium 70, they will experience a dielectrophoretic force that produces net movement in the direction of increasing field strength, which occurs at the periphery of the electrode fingers 55. As the nanowires 25 approach the electrode fingers 55 with spacing approximately equal to the length of the nanowires 25, the electric field strength between the electrode fingers 55 and nanowire tips increases proportionally to the inverse of the distance from the electrode fingers 55. It is this large near field force that results in vertical alignment of the nanowires 25 between the two electrode fingers 55. It should be noted that this example uses a combination of long range (here dielectorphoretic) and short range, near field electric field forces.

Figure 5:
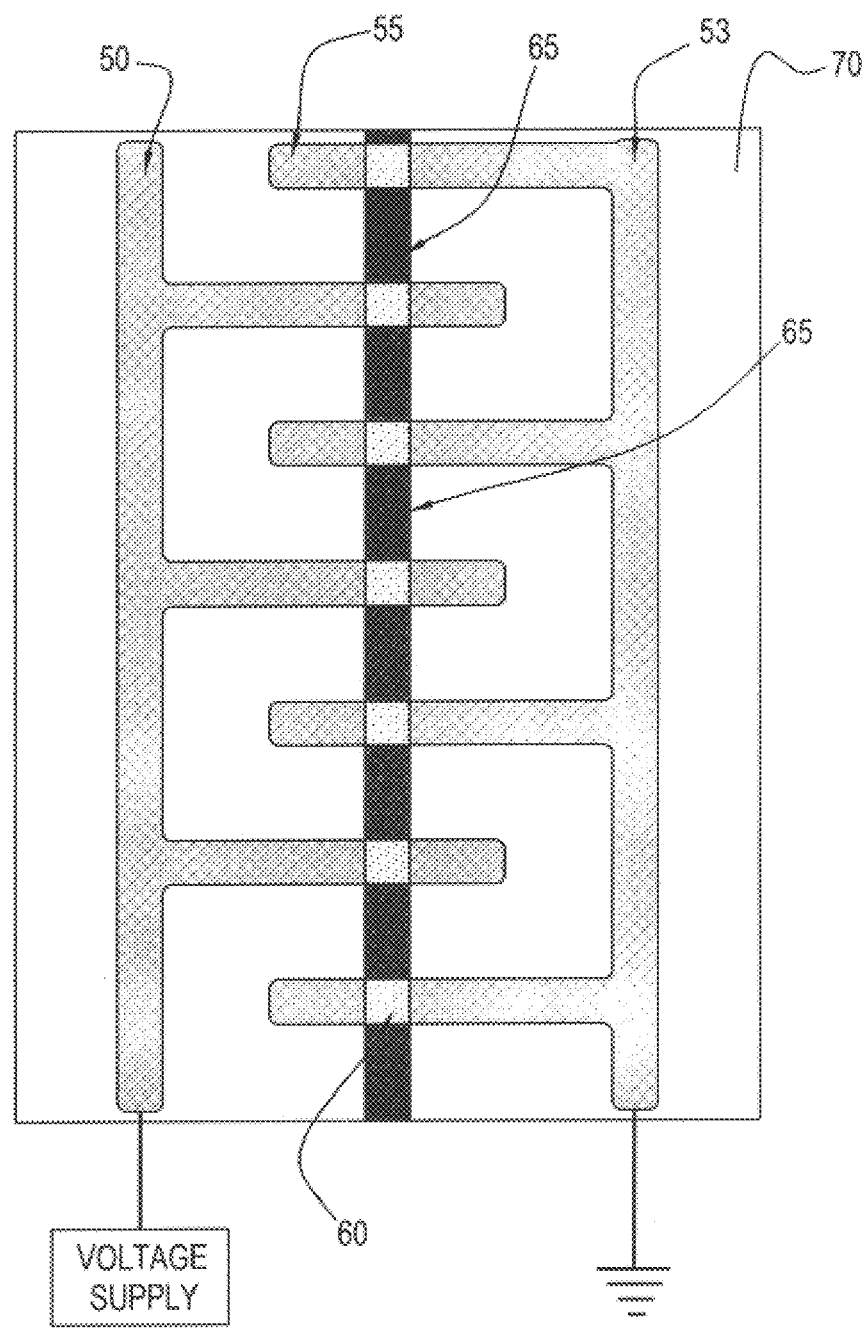
FIG. 5 shows an optical microscope image of nanowires aligned by applying a 20V, 1 kHz voltage to the structure with upper field electrodes.

The random placement of the nanowires 25 within the region of the thin $Si_3N_4$ layer 45 can be accounted for by considering the variation of the electric field strength as function of horizontal position during the assembly process. Prior to assembly, the vertically directed electric field strength at each point along the electrically isolated electrode fingers 55 is identical, making it equally probable that a nanowire 25 will align anywhere on the electrode fingers 55. As shown in FIG. 5, after a nanowire 65 aligns, the local electric field strength is reduced, which prevents additional nanowires from aligning in close proximity on the same and adjacent electrode fingers. Because the reduction in field strength is limited to a roughly 2 $\mu$m region surrounding the nanowire 65, alignment of subsequent nanowires will continue in a random fashion until the nanowires are depleted from the solution.

The strength of the forces exerted on the nanowires 25 are related to voltage and time dependencies of the vertical alignment. At a constant frequency, both the dielectrophoretic force that results in long range movement of the nanowires 25 toward the electrode fingers 55 and the short range near field forces are proportional to electric field strength. For this example, the force exerted on the nanowires 25 for voltages below 25 $V_{rms}$ is not sufficiently strong to cause alignment. As the electrode voltage is increased, the force on the nanowires 25 increases, resulting in improved alignment and reduced alignment times.

Figure 3:
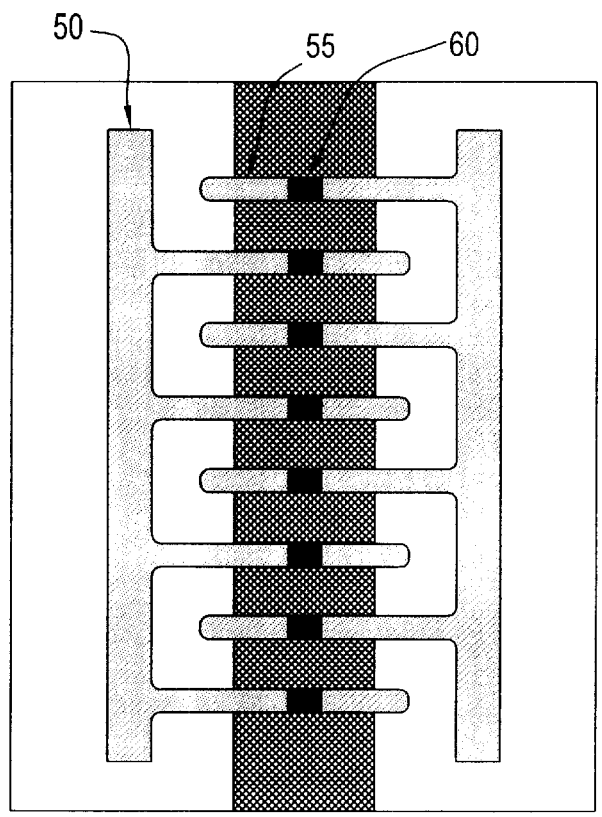
FIG. 3 shows top and cross-sectional views of example electrode structures for use in near-field electric field assisted assembly including conducting elements electrically isolated from all other conducting elements.
Figure 3:
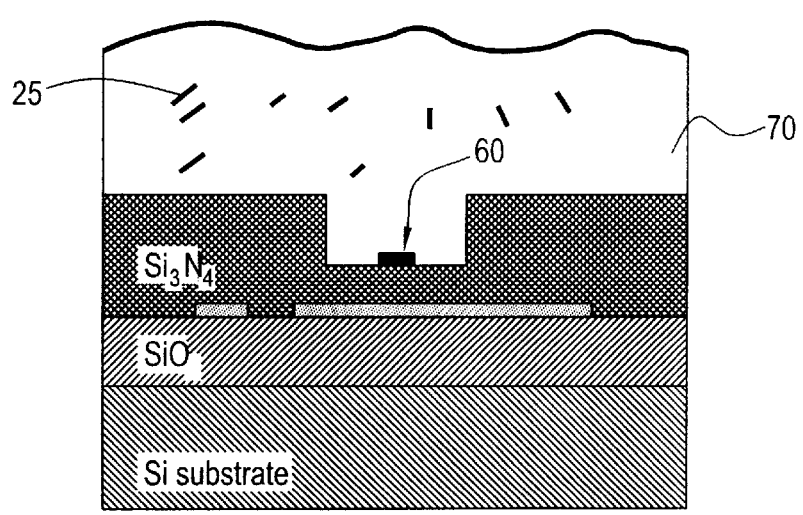
Figure 6:
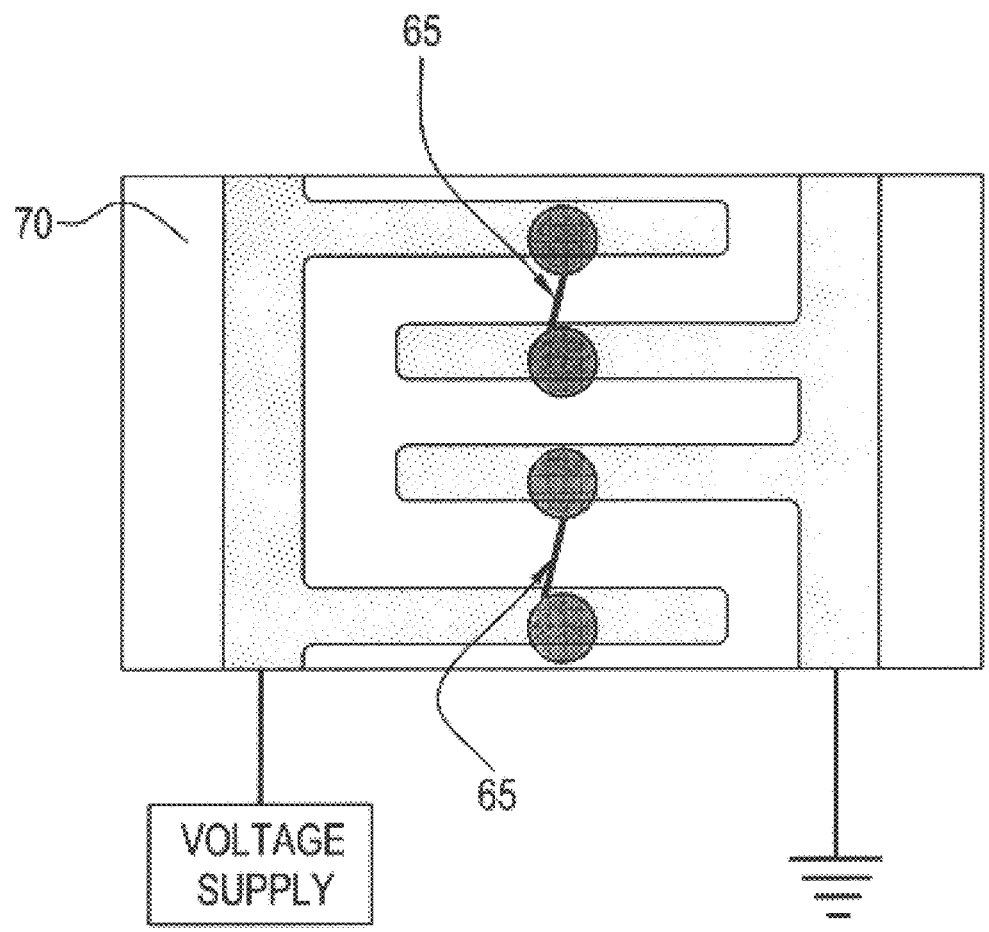
FIG. 6 shows a scanning electron microscope image of the nanowires aligned to the upper field electrodes.

To achieve horizontal as well as vertical alignment, field electrodes 60 having, for example, dimensions of 4×4 $\mu m^2$, are deposited on top of the thin $Si_3N_4$ layer 45 at the center of the electrode fingers as shown in the top view and cross section of FIG. 3. Capacitive coupling between the field electrodes 60 and the electrode fingers 55 results in an electric field strength that is much higher at the periphery of the field electrodes 60 than in the surrounding areas along the electrode fingers 55. FIGS. 5 and 6 show optical and scanning electron microscope (SEM) images of nanowires 65 that were aligned by applying a voltage of 20 $V_{rms}$ at a frequency of 1 kHz to electrode fingers 55. Under these conditions, the nanowires 65 align to bridge alternating pairs of adjacent field electrodes 60. For electrode voltages exceeding 25 $V_{rms}$, additional nanowires begin to align randomly along the electrode fingers as observed previously for the sample that did not contain electrically isolated field electrodes 60.

The additional degree of horizontal alignment obtained at low electrode voltages is due to the large electric field that is localized between adjacent field electrodes 60 and the force that this field induces on the nanowires 65. On this sample, when a nanowire 65 bridges adjacent field electrodes, the electric field between the pair of field electrodes 60 and the field electrodes on either side of them is eliminated. Because the field electrodes 60 have an insulating characteristic, the electric field between the pairs is eliminated but the nanowire 65 does not provide a conductive path between the electrode fingers 55. This allows for continued alignment of other nanowires. The modified electric field distribution accounts for the observed tendency of single nanowires to align between alternating pairs of field electrodes 60. It should be noted that the forces that provide precise horizontal and vertical alignment and capture are near field forces generated between the electrode structures and the parts being aligned and are not directly related to longer range dielectrophoretic forces that may also be present.

The frequency dependence of nanowire alignment was studied by fixing the voltage between the bottom electrodes at 20 $V_{rms}$ and varying the frequency from 20 Hz to 20 kHz. Some field-induced movement of the nanowires was observed for frequencies below 200 Hz. As the frequency was increased to 1 kHz, the nanowires began to bridge the field electrodes 60. The alignment time decreased for frequencies greater than 1 kHz, with the fastest alignment of less than 1 sec. occuring at the highest frequency of 20 kHz.

The reduction in alignment time with increasing frequency suggests that the double layer surrounding the metallic nanowire plays an important role in the alignment process. At low frequencies, the polarized double layer masks the charge separation on the nanowire leading to relatively low alignment forces. As the frequency increases, the double layer becomes more diffuse due to its long relaxation time. This results in greater net polarization of the nanowire tips and stronger alignment forces.

While the invention has been particularly shown and described with respect to preferred embodiments thereof, it will be understood by those skilled in the art that changes in form and details may be made therein without departing from the scope and spirit of the invention. In particular, it should be understood that the alignment process described can be used to align parts over a wide range of sizes from molecular or nanoscale to cm or even large scale. In addition, although simple interdigitated electrode structures were used for illustration, it should be understood that any electrode structure that provides near field electric field alignment forces can be used. Materials for such electrodes include conducting and dielectric elements as well as elements with differing permitivity.

What is claimed is:

1. An electric field assisted assembly process using short-range electric field effects, either singly or in combination with longer range electric field effects, process comprising:

forming a short-range electric field alignment electrode structure on a substrate, said electrode structure having a field electrode capacitively coupled to said electrode structure;

supplying apparatus parts in a fluid dielectric medium near said electrode structure; and appplying an AC or DC voltage to said electrode structure that induces a non-uniform electric field in said dielectric medium to align one of said parts in a predetermined position proximate to said field electrode, wherein inducing said non-uniform electric field produces a dielectrophoretic force so as to cause a dipole moment in said parts to move said parts sufficiently close to said filed electrode such that said short range electric field alignment electrode structure cause said one of said parts to align.

2. The process of claim 1, wherein the electrode structure includes interdigitated electrodes.

3. The process of claim 1, wherein said field electrode is electrically insulated from said electrode structure.

4. The process of claim 1, wherein alignment of said one of said parts is facilitated by mechanical agitation.

5. The process of claim 1, wherein said parts and said substrate are treated to prevent adhesion there between.

6. The process of claim 1, wherein said parts and said substrate are treated to cause hydrophobic/hydrophilic or other surface energy effect to aid in the alignment process.

7. The process of claim 1, wherein said parts are semiconductor die.

8. The process of claim 1, wherein said parts are nanometer wires.

9. The process of claim 1, wherein said parts are micro or nano structures.

10. The process of claim 1, wherein said electrode structure further comprises an array of field electrodes, and said non-uniform electric field aligns individual ones of said parts in pre-determined positions proximate said field electrodes.

11. An electric field assisted assembly process using short-range electric field effects, either singly or in combination with longer range electric field effects, process comprising:

forming a short-range electric field alignment electrode structure on a substrate, said electrode structure having a field electrode capacitively coupled to said electrode structure;

supplying apparatus parts in a fluid dielectric medium near said electrode structure; and appplying an AC or DC voltage to said electrode structure that induces a non-uniform electric field in said dielectric medium to align one of said parts in a pre-determined position proximate to said field electrode, wherein alignment of said one of said parts causes a shielding of said non-uniform electric field in said predetermined position so as to prevent further parts from being aligned to said predetermined position.

12. The process of claim 11, wherein said electrode structure includes interdigitated electrodes.

13. The process of claim 11, wherein said field electrode is electrically insulated from said electrode structure.

14. The process of claim 11, wherein alignment of said one of said parts is facilitated by mechanical agitation.

15. The process of claim 11, wherein said parts and said substrate are treated to prevent adhesion there between.

16. The process of claim 11, wherein said parts and said substrate are treated to cause hydrophobic/hydrophilic or other surface energy effect to aid in the alignment process.

17. The process of claim 11, wherein said parts are semiconductor die.

18. The process of claim 11, wherein said parts are nanometer wires.

19. The process of claim 11, wherein said parts are micro or nano structures.

20. The process of claim 11, wherein said electrode structure further comprises an array of field electrodes, and said non-uniform electric field aligns individual ones of said parts in said pre-determined position proximate said field electrodes.

21. An electric field assisted assembly process using short range electric field effects, either singly or in combination with longer range electric filed effects, process comprising:

forming a short range electric field alignment electrode structure with size scale similar to apparatus parts to be aligned on a substrate, said electrode structure having a field electrode capacitively coupled to said electrode structure;

supplying said apparatus parts in a fluid dielectric medium near said electrode structure; and applying a non-uniform electric field to align one of said parts in a pre-determined position proximate said field electrode, wherein said applying of said non-uniform electric field produces a dielectrophoretic force so as to induce a dipole moment in said parts to move the parts sufficiently close to said electrode structures that said short range elextric field alignment electrode structure is effective.

22. The process of claim 21, wherein said electrode structure included interdigitated electrodes.

23. The process of claim 21, wherein said field electrode is electrically insulated from said electrode structure.

24. The process of claim 21, wherein alignment of said one of said parts is facilitated by mechanical agitation.

25. The process of claim 21, wherein said parts and said substrate are treated to prevent adhesion there between.

26. The process of claim 21, wherein said parts and said substrate are treated to cause hydrophobic/hydrophilic or other surface effects to aid in the alignment process.

27. The process of claim 21, wherein said parts are semiconductor die.

28. The process of claim 21, wherein said parts are nanometer wires.

29. The process of claim 21, wherein said parts are micro or nano structures.

30. An electric field assisted assembly process using short range electric field effects, either singly or in combination with longer range electric filed effects, process comprising:

forming a short range electric field alignment electrode structure with size scale similar to apparatus parts to be aligned on a substrate, said electrode structure having a field electrode capacitively coupled to said electrode structure;

supplying said apparatus parts in a fluid dielectric medium near said electrode structure; and applying a non-uniform electric field to align one of said parts in a pre-determined position proximate said field electrode, wherein alignment of said one of said parts causes a shield of said non-uniform electric field in said pre-determined position so as to prevent additional parts from being aligned to said pre-determined position.

31. The process of claim 30, wherein the electrode structure included interdigitated electrodes.

32. The process of claim 30, wherein said field electrode is electrically insulated from said electrode structure.

33. The process of claim 30, wherein alignment of said one of said parts is facilitated by mechanical agitation.

34. The process of claim 30, wherein said parts and said substrate are treated to prevent adhesion there between.

35. The process of claim 30, wherein said parts and said substrate are treated to cause hydrophobic/hydrophilic or other surface effects to aid in the alignment process.

36. The process of claim 30, wherein said parts are semiconductor die.

37. The process of claim 30, wherein said parts are nanometer wires.

38. The process of claim 30, wherein said parts are micro or nano structures.

* * * * *